(12) United States Patent
Tokimoto

(10) Patent No.: US 8,042,262 B2
(45) Date of Patent: Oct. 25, 2011

(54) TEMPORARILY FIXING DEVICE

(75) Inventor: Hideki Tokimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 692 days.

(21) Appl. No.: 12/086,005

(22) PCT Filed: Dec. 11, 2006

(86) PCT No.: PCT/JP2006/324694
§ 371 (c)(1),
(2), (4) Date: Jun. 4, 2008

(87) PCT Pub. No.: WO2007/108184
PCT Pub. Date: Sep. 27, 2007

(65) Prior Publication Data
US 2009/0265925 A1 Oct. 29, 2009

(30) Foreign Application Priority Data

Mar. 20, 2006 (JP) ................................. 2006-077203

(51) Int. Cl.
*B23P 19/00* (2006.01)
(52) U.S. Cl. .......................................... 29/739; 29/740
(58) Field of Classification Search .................... 29/739, 29/740
See application file for complete search history.

(56) References Cited

FOREIGN PATENT DOCUMENTS

| JP | 49-118652 A | 11/1974 |
|---|---|---|
| JP | 54-12056 U | 1/1979 |
| JP | 2005-72441 A | 3/2005 |
| JP | 2005072441 | * 3/2005 |

* cited by examiner

*Primary Examiner* — Carl Arbes
(74) *Attorney, Agent, or Firm* — Birch, Stewart, Kolasch & Birch, LLP

(57) ABSTRACT

A temporarily fixing device includes a frame-shaped structure member having a hole in its central part and a stepped portion around the hole; a board mounted on the stepped portion of the frame-shaped structure member; a simultaneously-pressing member into which a base pressing the board to the stepped portion and a pressing portion pressing at least one or more circuit components onto the board are unitized in its connection part; a shaft provided on the frame-shaped structure member so as to rotatably and vertically movably support the base of the simultaneously-pressing member; and a pressure member normally pressing the simultaneously-pressing member to the surface of the frame-shaped structure member.

4 Claims, 3 Drawing Sheets

TEMPORARILY FIXING DEVICE

CROSS REFERENCE TO RELATED APPLICATIONS

This nonprovisional application claims the benefit of Japanese Application No. 2006-077203 filed on Mar. 20, 2006 and to PCT patent Application No. PCT/JP2006/324694 filed on Dec. 11, 2006.

TECHNICAL FIELD

The present invention relates to a temporarily fixing device excellent for use in temporarily fixing circuit components of which the lead terminals are inserted in holes of a printed wiring board (hereinafter referred to as a board) mounted on a stepped portion around a hole of a frame-shaped structure member to the board.

BACKGROUND ART

Conventionally, when a plurality of circuit components such as connectors and switches are secured to a printed board by soldering, the lead terminals of the circuit components are passed through the holes of the printed board to be soldered. Since in soldering the lead terminals thereof the terminals may be dislodged or floated from the holes, the lead terminals are bent to be temporarily fixed to the printed board, followed by the process that the lead terminals are soldered to the board. However, this procedure requires a bending process for bending the lead terminals. For this reason, there is a disclosure for a technology for eliminating the necessity of the above-described bending process by pressing circuit components from above to a board, in order to eliminate the need of the process of bending the lead terminals thereof (for example, see Patent Document 1).

Patent Document 1: JP-A-2005-072441

However, although the arrangement as disclosed in Patent Document 1 does not have the necessity of bending the lead terminals of circuit components, the arrangement individually requires temporary fixing of a board to a frame-shaped structure member and temporary fixing of the circuit components to the board. Therefore, there is a problem that the temporarily fixing process is complicated to thus effect a high production cost.

The present invention has been made to solve the above-mentioned problems, and an object of the present invention is to provide a temporarily fixing device capable of simultaneously temporarily fixing a board to the mounting location of a frame-shaped structure member and at least one or more circuit components of which the lead terminals are inserted in the holes of the board to the board, and thereby, can prevent the accidental dislodgements or lifts of the board and the circuit components in soldering at the same time.

DISCLOSURE OF THE INVENTION

The temporarily fixing device according to the present invention includes a frame-shaped structure member having a hole in its central part and a stepped portion around the hole; a board mounted on the stepped portion of the frame-shaped structure member; a simultaneously-pressing member into which a base pressing the board to the stepped portion and a pressing portion pressing at least one or more circuit components onto the board are unitized in its connection part; a shaft provided on the frame-shaped structure member so as to rotatably and vertically movably support the base of the simultaneously-pressing member; and a pressure member normally pressing the simultaneously-pressing member to the surface of the frame-shaped structure member.

The temporarily fixing device according to the present invention is arranged such that the board and at least one or more circuit components can be simultaneously temporarily fixed, which can eliminate the necessity of the process of bending the lead terminals of circuit components, simultaneously prevent the accidental dislodgements of the circuit components and the board in soldering by means of a simple arrangement, simplify the temporarily fixing process, and reduce the production cost.

BEST MODE FOR CARRYING OUT THE INVENTION

Embodiments of the present invention will now be described with reference to the accompanying drawings in order to explain the present invention in more detail.

First Embodiment

Figure 1:
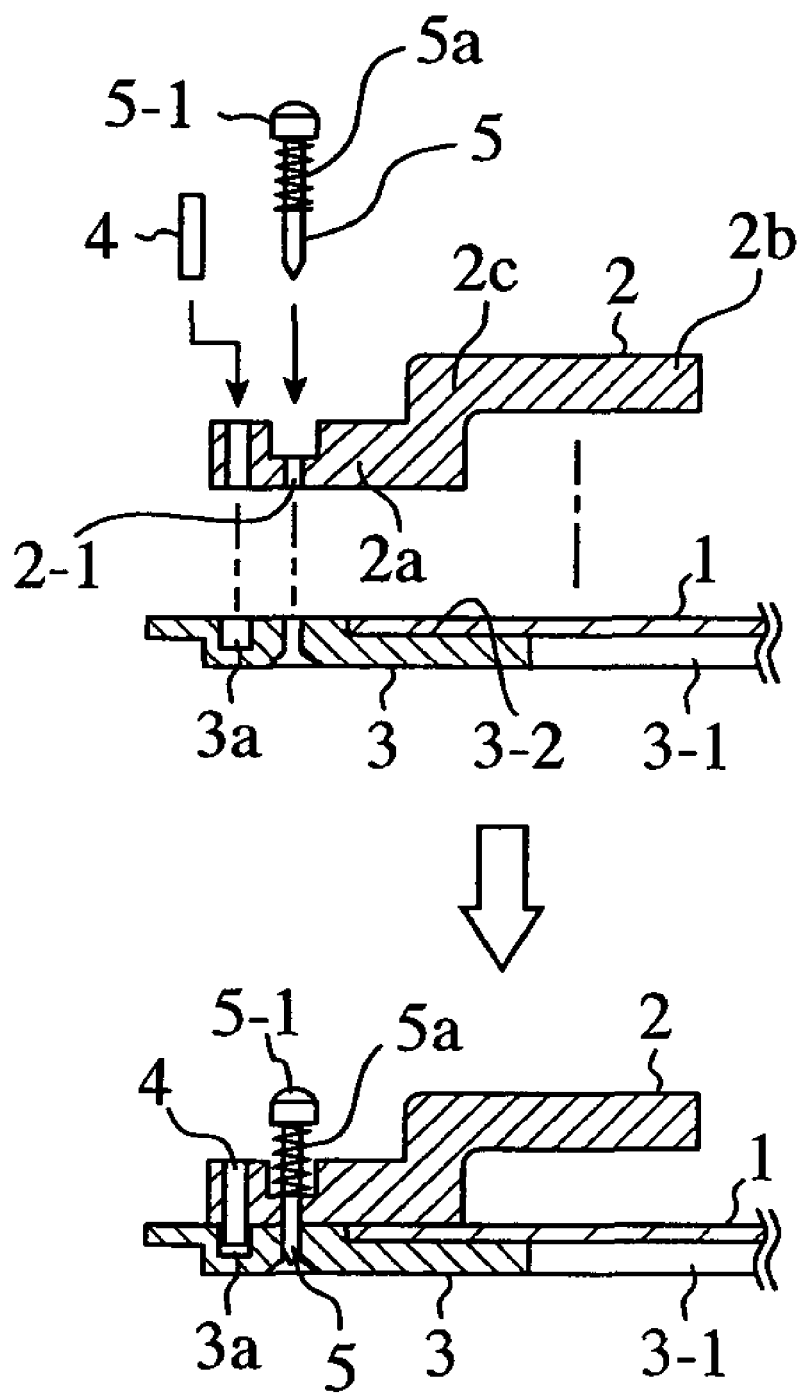
FIG. 1 is an exploded perspective view showing the structure of a temporarily fixing device in accordance with the first embodiment of the present invention.
Figure 2:
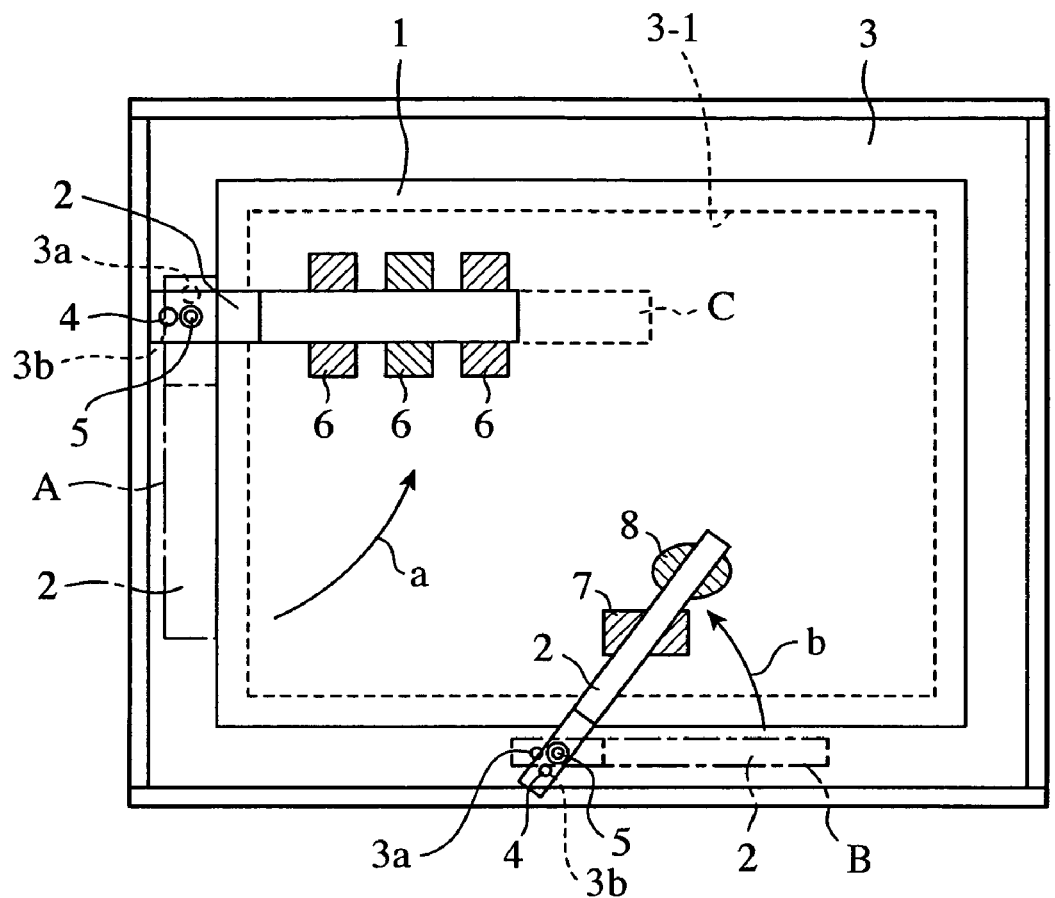
FIG. 2 is a plan view showing the jigs of the temporarily fixing device in an assembled state in accordance with the first embodiment of the present invention.
Figure 3:
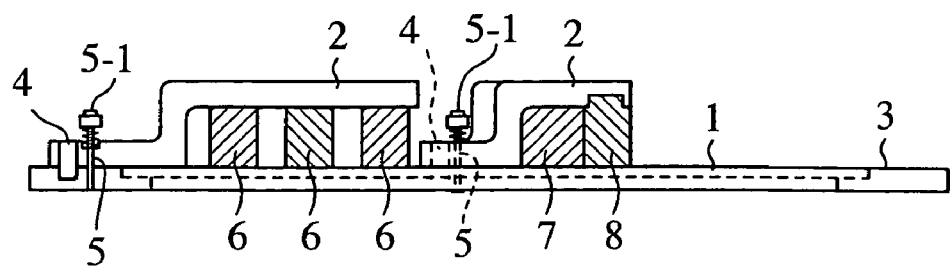
FIG. 3 is a front view of FIG. 2 showing the temporarily fixing device in a working state in accordance with the first embodiment of the present invention.
Figure 4:
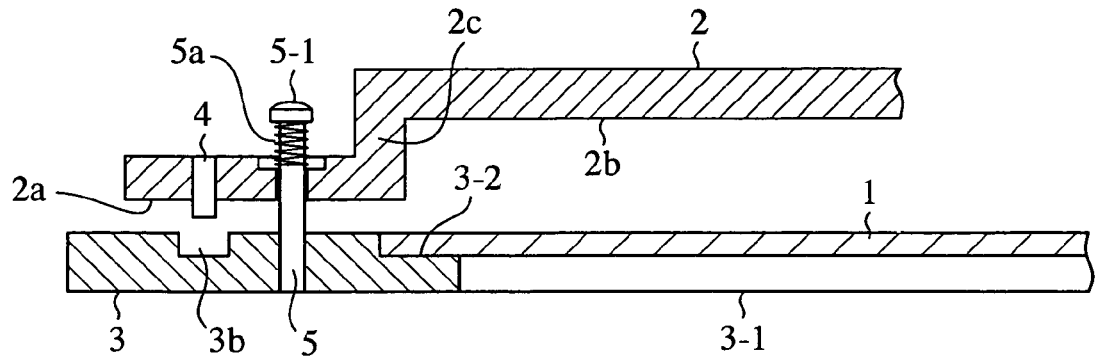
FIG. 4 is an enlarged sectional view of the main part thereof explaining an operation of the temporarily fixing device in accordance with the first embodiment of the present invention.

FIG. 1 is an exploded perspective view showing the structure of a temporarily fixing device in accordance with the first embodiment of the present invention, FIG. 2 is a plan view showing the temporarily fixing device in accordance with the first embodiment of the present invention in a working state, FIG. 3 is a front view of FIG. 2, and FIG. 4 is an enlarged sectional view of the main parts thereof explaining an operation of the temporarily fixing device.

In the drawings, a board 1 is mounted on a stepped portion 3-2 around a hole 3-1 formed through the central portion of a frame-shaped structure member 3. A simultaneously-pressing member 2 is a member into which a base 2a pressing the board 1 to the stepped portion 3-2 and a pressing portion 2b pressing at least one or more circuit components 6 (7, and 8) onto the board 1 are unitized in a connection part 2c, and an example of the member as shown in the figure is formed in an L shape. The simultaneously-pressing member 2 fits a hole 2-1 provided through the base 2a thereof around a shaft 5 provided on the frame-shaped structure member 3 to rotatably and vertically movably support the simultaneously-pressing member. The shaft 5 is provided with a coil spring 5a serving as an energizing member normally or always pressing the simultaneously-pressing member 2 onto the frame-shaped structure member 3, and located between a shaft head 5-1 and the simultaneously-pressing member 2.

Further, the end part of the simultaneously-pressing member 2 in the vicinity of the shaft 5, and the face of the frame-shaped structure member 3 opposed to the end part thereof are provided with first positioning engagement projection/receptacle sections 3a, 4 that engage with each other when the simultaneously-pressing member 2 is positioned outside the central hole 3-1 of the frame-shaped structure member 3 and second positioning engagement projection/receptacle sections 3b, 4 that engage with each other when the simultaneously-pressing member 2 is shifted into position to press the circuit components 6 mounted on the board 1.

Next, the temporarily fixing work of the temporarily fixing device with the above-described structure will now be described.

All the simultaneously-pressing members 2 are located in the chain-line positions A, B as shown in FIG. 2. At that time, each of the simultaneously-pressing members 2 is held by an engagement between the first positioning engagement projection/receptacle sections 3a, 4. Under the conditions, a board 1 is mounted on the stepped portion 3a around the hole of the frame-shaped structure member 3, circuit components are mounted on a predetermined position of the board 1, and then, the lead terminal thereof is passed through the hole of the board.

It should be noted that in the example as depicted, the simultaneously-pressing member 2 is provided with engagement projections 4 and the surface of the frame-shaped structure member 3 is provided with engagement receptacles 3a, 3b for the first positioning engagement projection/receptacle sections 3a, 4 and the second positioning engagement projection/receptacle sections 3b, 4. To the. contrary, it may be arranged that the simultaneously-pressing member 2 be provided with the engagement receptacles and the surface of the frame-shaped structure member 3 be provided with the engagement projections.

Moreover, as shown in FIG. 4, when each of the simultaneously-pressing members 2 is lifted against the energizing force of the coil spring 5a, the engagement between the first positioning engagement projection/receptacle sections 3a, 4 is released to rotate the simultaneously-pressing members in the directions indicated by the arrows "a" and "b" as shown in FIG. 2, respectively, and then, the lifting force is released in the solid line positions shown in FIG. 2, the simultaneously-pressing member 2 is lowered by the energizing force of the coil spring 5a, the base 2a presses the board 1, with an engagement between the second positioning engagement projection/receptacle sections 3b and 4, to the stepped portion 3a to temporarily fix the board, and the pressing portion 2b presses the circuit components to the board 1 to temporarily fix the components. The simultaneously-pressing member 2 does not move by virtue of the engagement between the second positioning engagement projection/receptacle sections 3b, 4 even if the member is vibrated in soldering, and the member can positively maintain the temporarily fixing state.

As described above, in accordance with the first embodiment, since the board and at least one or more circuit components can be concurrently temporarily fixed by the integral-type simultaneously-pressing member 2, there are obtained advantageous effects that the working efficiency can be improved because of the simple temporarily fixing process, the production cost can be reduced at the same time, and moreover, the accidental dislodgements of the circuit components and the board in soldering can be simultaneously prevented to thus contribute to an improved quality of products.

Furthermore, the temporarily fixing device is arranged to include the first positioning engagement projection/receptacle sections that engage with each other when the simultaneously-pressing member is positioned outside the central hole of the frame-shaped structure member, and the second positioning engagement projection/receptacle sections that engage with each other when the simultaneously-pressing member is shifted into position to press the circuit components mounted on the board. This can reliably locate and fix the simultaneously-pressing member 2 in respective positions. For this reason, it becomes easy to attach the board 1 to the stepped portion 3-2 and detach the board therefrom, and further, it becomes possible to surely press the circuit components to the board to be held thereon.

Second Embodiment

Figure 5:
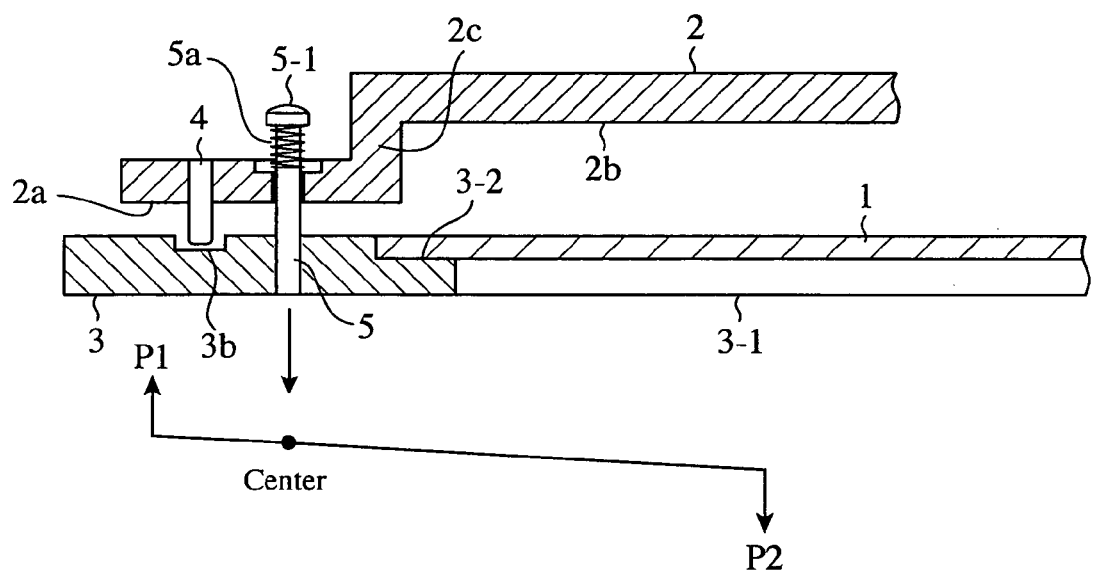
FIG. 5 is an enlarged sectional view of the main part thereof explaining an operation of a temporarily fixing device in accordance with the second embodiment of the present invention.

FIG. 5 is an enlarged sectional view of the main part of a temporarily fixing device in accordance with the second embodiment of the present invention, and explaining an operation thereof. It should be noted that in FIG. 5, the parts thereof corresponding to those in FIG. 1 to FIG. 4 are designated by similar reference numerals, and repetitive explanations will be omitted.

As shown in FIG. 5, in the second embodiment, it is arranged that the tip of the projection 4 of the first positioning engagement projection/receptacle sections abut against the bottom of the receptacle 3a of the sections before the base 2a of the simultaneously-pressing member 2 abuts against the top surface of the frame-shaped structure member 3. Such an arrangement may continue giving the energizing force of the coil spring 5a to the simultaneously-pressing member 2, as illustrated by the drawing of FIG. 5, even after the engagement projection/receptacle sections 3a, 4 are engaged with each other. For this reason, the engagement projection 4 is upwardly forced in the direction indicated by the arrow P1 with the shaft 5 as a center to be worked by the energizing force, while the side opposite from the shaft 5 of the simultaneously-pressing member is downwardly forced in the direction indicated by the arrow P2, with the base 2a pressing the board 1 to the stepped portion 3a to temporarily fix the board, and the pressing portion 2b pressing the circuit components 6-8 to the board 1 to temporarily fix the components.

As stated above, in accordance with the second embodiment, when it is arranged that an engagement between the engagement projection/receptacle sections 3a, 4 is completed in a state where the end of the simultaneously-pressing member 2 is lifted, the simultaneously-pressing member 2 can press and hold the board 1 and the circuit components 6-8 in an inclined state. This enables the board 1 and the circuit components 6-8 to be positively temporarily fixed by a small energizing force.

Third Embodiment

Figure 6:
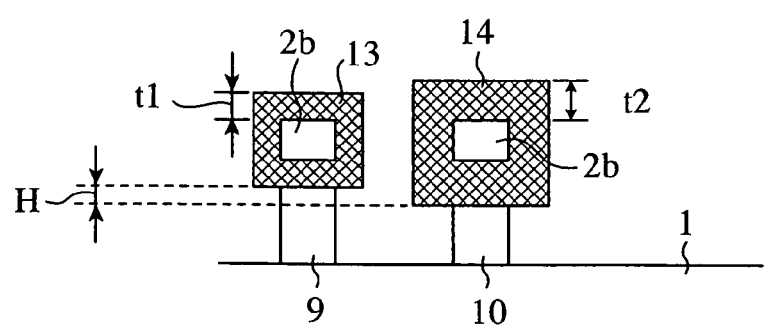
FIG. 6 is a view showing a temporarily fixing device in an assembling relationship in accordance with the third embodiment of the present invention.

FIG. 6 is a view showing a temporarily fixing device in accordance with the third embodiment of the present invention in an assembled relationship. Hereupon, in FIG. 6, the parts thereof corresponding to those in FIG. 1 to FIG. 4 are designated by similar reference numerals, and repetitive explanation will be omitted.

In FIG. 3, in order to simultaneously press circuit components 7 and 8 different from each other in height, the pressing portions 2b of the simultaneously-pressing members 2 having a thickness t1 and t2, different from each other, respectively, are employed. However, the preparation of dedicated simultaneously-pressing members 2 compatible with the circuit components of different heights may increase the number of working processes for exchanging the simultaneously-pressing members 2 with an increase in the number of circuit components, thereby resulting in an increase of the production cost.

For this reason, in the third embodiment, a plurality of cylindrical height-adjusting members 13, 14 are prepared, which are different in thickness for adjusting the difference of height of the circuit components 9, 10 to be temporarily fixed to the board 1. Those cylindrical height-adjusting members 13, 14 are interchangeably attached to the pressing portion 2b of the simultaneously-pressing member 2 corresponding to the heights of the circuit components to conform the heights of the circuit components 9 and 10. In such a way, the circuit components having a different height can be temporarily fixed to the board 1 with the same simultaneously-pressing member 2.

As mentioned above, in accordance with the third embodiment, interchangeably attaching the height-adjusting member to the simultaneously-pressing member makes it possible to positively temporarily fix the circuit components different in height to the board with normally stable supporting force without exchanging the simultaneously-pressing members.

Fourth Embodiment

In accordance with the fourth embodiment, the pressing portion 2b of the simultaneously-pressing member 2 is arranged to freely expand with the pressing surface of the portion being flush with-the expanded portion. As shown by the dashed line C in FIG. 2, when the basal length of the simultaneously-pressing member 2 is insufficient due to the high number of circuit components 6, the pressing portion 2b of the simultaneously-pressing member 2 is elongated like a tripod of a camera, thus enabling all the circuit components 6 to be temporarily fixed. Thereby, the temporarily fixing device enables to respond quickly to the change of the number of the circuit components, which can enhance the working efficiency.

Industrial Applicability

As described above, since the temporarily fixing device according to the present invention is arranged to positively press at least one or more circuit components onto a board, and simultaneously prevents the accidental dislodgements of the circuit components and the board, the temporarily fixing device is suitable for use as temporarily fixing devices or the like used when a plurality of circuit components such as connectors and switches are secured to a printed board by soldering.

The invention claimed is:

1. A temporarily fixing device comprising:
   a frame-shaped structure member having a hole in its central part and a stepped portion around the hole;
   a board mounted on the stepped portion of the frame-shaped structure member:
   a simultaneously-pressing member into which a base pressing the board to the stepped portion and a pressing portion pressing at least one or more circuit components onto the board are unitized in its connection part;
   a shaft provided on the frame-shaped structure member so as to rotatably and vertically movably support the base of the simultaneously-pressing member;
   a pressure member normally pressing the simultaneously-pressing member to the surface of the frame-shaped structure member;
   first positioning engagement projection/receptacle sections that engage with each other when the simultaneously-pressing member is positioned outside the central hole of the frame-shaped structure member; and
   second positioning engagement projection/receptacle sections that engage with each other when the simultaneously-pressing member is shifted into position to press a circuit component mounted on the board.

2. The temporarily fixing device according to claim 1, wherein it is arranged that the tip of the projection of the first positioning engagement projection/receptacle sections abut against the bottom of the receptacle of the sections before the base of the simultaneously-pressing member abuts against the top surface of the frame-shaped structure member.

3. The temporarily fixing device according to claim 1, wherein the pressing portion of the simultaneously-pressing member includes cylindrical height adjusting members different in thickness which are interchangeably attached to the portion.

4. The temporarily fixing device according to claim 1, wherein the pressing portion of the simultaneously-pressing member is arranged to freely expand with the pressing surface of the portion being flush with the expanded part.

* * * * *